United States Patent [19]

Maruyama et al.

[11] Patent Number: 4,912,749
[45] Date of Patent: Mar. 27, 1990

[54] NONVOLATILE SEMICONDUCTOR MEMORY

[75] Inventors: Tadashi Maruyama; Yukio Wada; Tomohisa Shigematsu; Yasoji Suzuki, all of Yokohama; Makoto Yoshizawa, Tokyo, all of Japan

[73] Assignee: Kabushiki Kaisha Toshiba, Kawasaki, Japan

[21] Appl. No.: 149,606

[22] Filed: Jan. 28, 1988

[30] Foreign Application Priority Data

Jan. 31, 1987 [JP] Japan .................................. 62-21087

[51] Int. Cl.$^4$ .............................................. G11C 11/34
[52] U.S. Cl. ..................................... 365/185; 357/23.5
[58] Field of Search ........................ 365/185; 357/23.5

[56] References Cited

U.S. PATENT DOCUMENTS

| 4,375,087 | 2/1983 | Wanlass | 365/185 |
| 4,558,344 | 12/1985 | Perlegos | 357/59 |
| 4,611,309 | 9/1986 | Chuang | 365/185 |
| 4,628,487 | 12/1986 | Smayling | 365/185 |
| 4,710,900 | 12/1987 | Higuchi | 365/185 |
| 4,729,115 | 3/1988 | Kauffmann | 365/185 |
| 4,752,912 | 6/1988 | Guterman | 365/185 |

FOREIGN PATENT DOCUMENTS

| 0183235 | 6/1986 | European Pat. Off. | 365/185 |
| 0202785 | 11/1986 | European Pat. Off. | 365/185 |

Primary Examiner—James W. Moffitt
Attorney, Agent, or Firm—Finnegan, Henderson, Farabow, Garrett and Dunner

[57] ABSTRACT

In a nonvolatile semiconductor memory according to the invention, a power source voltage of 5 V used in an ordinary read mode is applied to a read line in the data read mode without changing its value. If a write line, a selection gate line, a control gate line, and a read line are respectively set at 0 V, 5 V, 0 V, and 5 V in the data read mode, the potential at an n-type diffusion layer becomes 0 V. In this case, the potential at the control gate line is 0 V, and the potential at a floating gate electrode becomes substantially 0 V. That is, an electric field is not applied to a thin insulating film located between the floating gate electrode and the n-type diffusion layer. As a result, electron injection and discharge due to the tunnel effect do not occur.

7 Claims, 8 Drawing Sheets

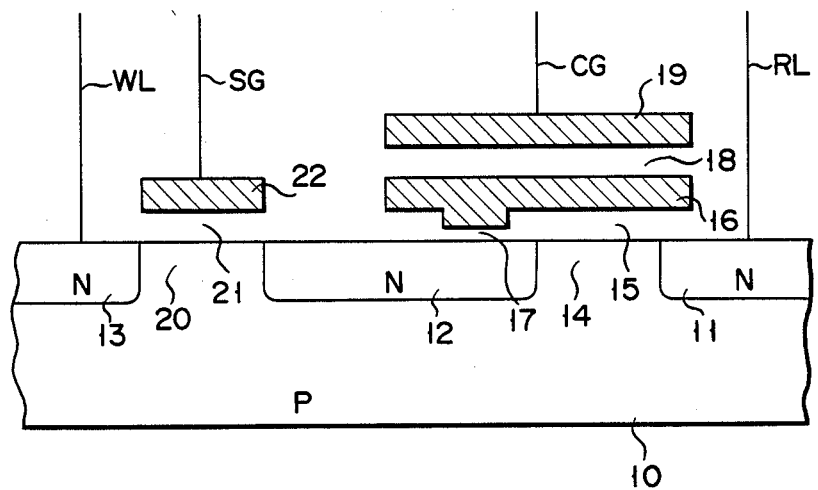
F I G. 4

| MODE | ERASE | WRITE | READ |
|---|---|---|---|
| BL | 0V | 20V | 1V |
| SG | 20V | 20V | 5V |
| CG | 20V | 0V | 0V |
| S | 0V | 5V | 0V |

| MODE | ERASE | WRITE | READ |
|---|---|---|---|
| WL | 0V | 20V | 0V |
| SG | 20V | 20V | 5V |
| CG | 20V | 0V | 0V |
| RL | 0V | 5V | 5V |

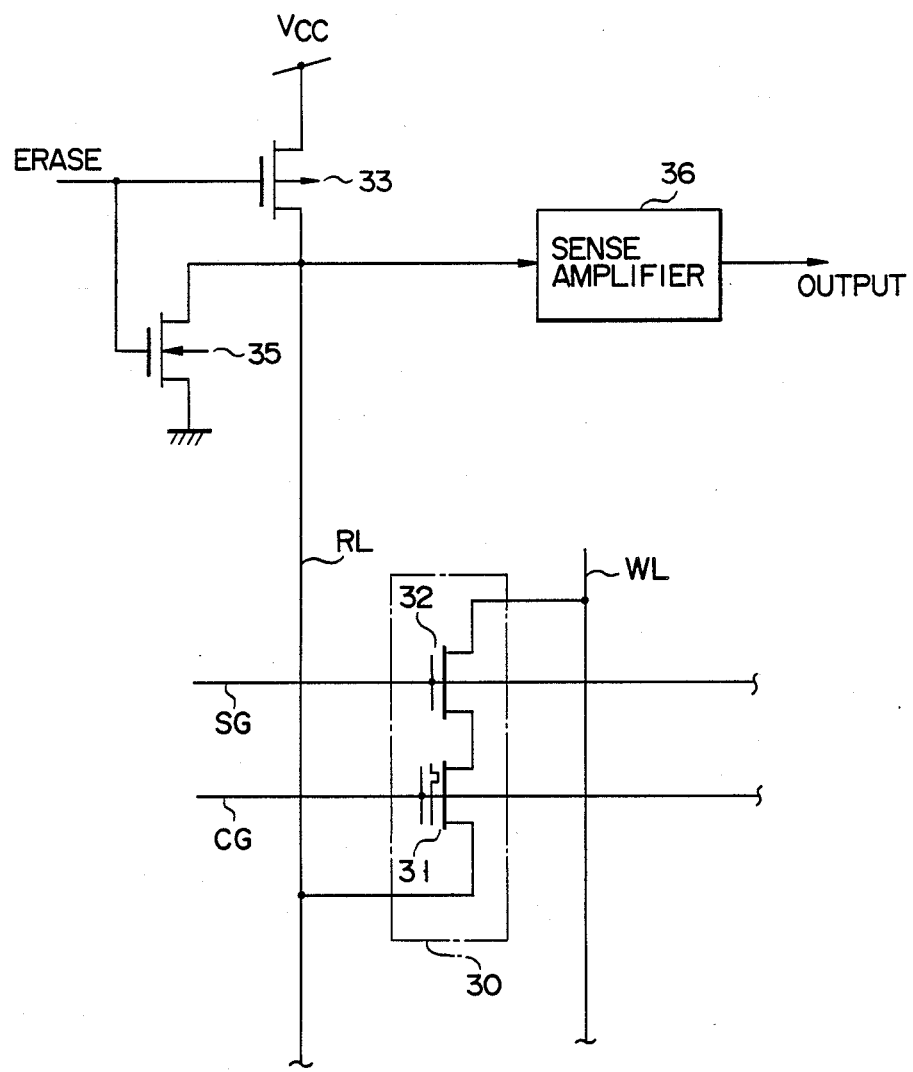
F I G. 8

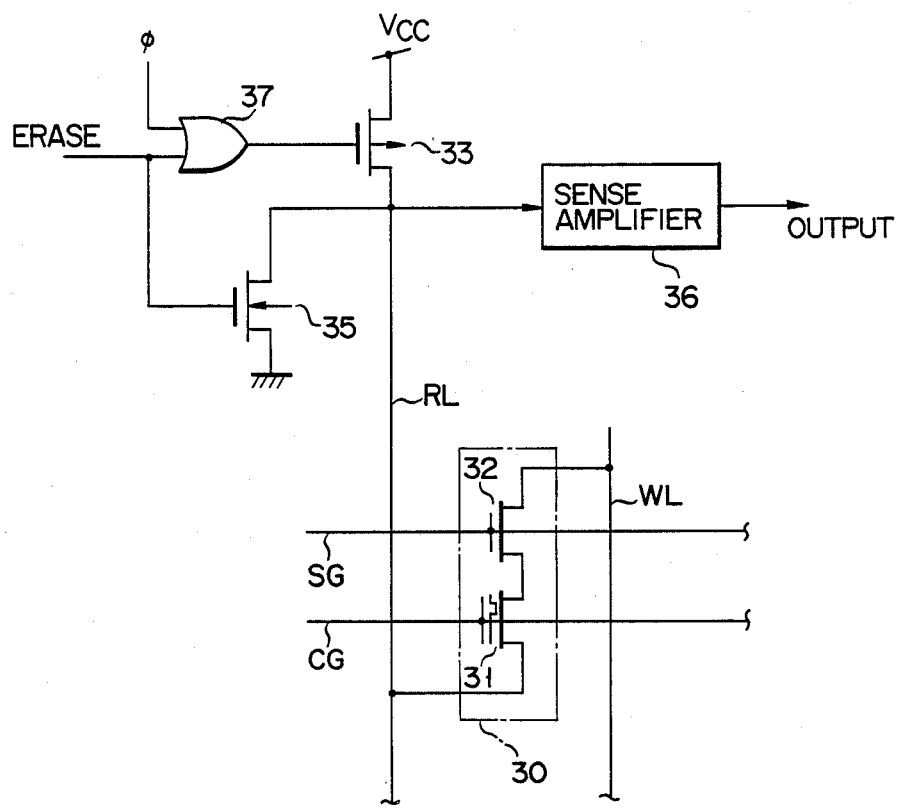
F I G. 9
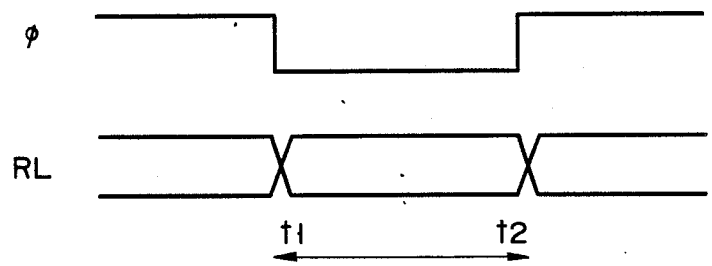
F I G. 10

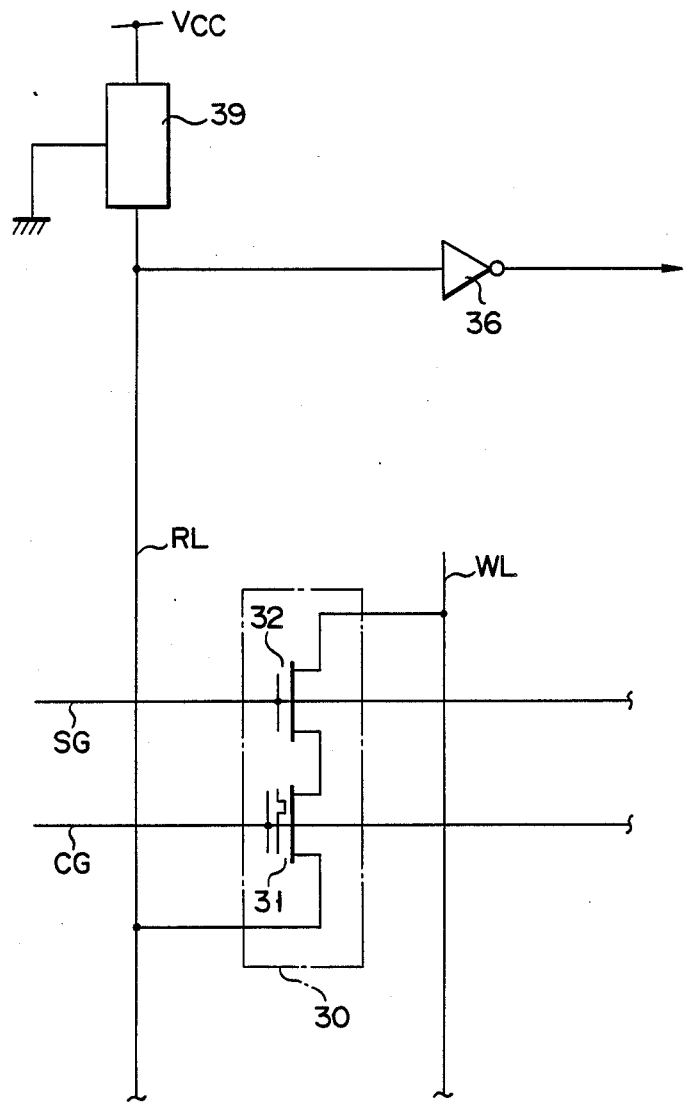
F I G. 13

NONVOLATILE SEMICONDUCTOR MEMORY

BACKGROUND OF THE INVENTION

The present invention relates to a nonvolatile semiconductor memory in which data can be electrically rewritten using nonvolatile transistors.

A well-known nonvolatile semiconductor memory in which data can be electrically rewritten is the E$^2$PROM (Electrically Erasable and Programmable Read Only Memory). While E$^2$PROMs can have any of a number of different memory cell structures, most, however, tend to be of floating gate type structure, in which a floating gate electrode partially overlaps a diffusion layer, through a thin insulating film.

FIG. 1 is a sectional vie showing the structure of one such conventional memory cell. N-type diffusion layers 11, 12, and 13 are formed in a surface of p-type semiconductor substrate 10. Channel region 14 is formed between diffusion layers 11 and 12. Polysilicon electrode 16 is formed above channel region 14 and parts of diffusion layers 11 and 12. One portion of electrode 16 is thicker than the remainder thereof and is formed above diffusion layer 12. Insulation film 15 (described in detail later) is formed between substrate 10 and polysilicon electrode 16. This film 15 has thin insulation film 17 located between diffusion layer 12 and the thicker portion of electrode 16. In addition, polysilicon electrode 1 is formed above electrode 16 interposing insulating film 18 having a thickness almost equal to that of insulating film 15.

Channel region 20 i formed between diffusion layers 12 and 13. Polysilicon electrode 22 is formed above channel region 2 interposing insulating film 21 having a thickness almost equal to that of insulating film 15.

Diffusion layers 11 and 13 are respectively connected to source wiring S and bit line BL. Electrodes 16, 19, and 22 are respectively used as a floating gate electrode, a control gate electrode, and a gate electrode. Control gate electrode 19 and gate electrode 22 are connected to control gate line CG and selection gate line SG, respectively.

FIG. 2 is an equivalent circuit diagram of the conventional cell having the structure shown in FIG. 1. Transistor 41, as shown in FIG. 2, is of floating gate type. Diffusion layers 11 and 12 of transistor 41 are used as a source and a drain, respectively, transistor 41 itself constituting a memory transistor for storing data. Transistor 42 is of normal MOS type. Diffusion layers 12 and 13 of transistor 42 are used as a source and a drain, respectively, transistor 42 itself constituting a selection transistor for selecting memory transistor 41.

The operation modes of the above memory cell include data erase, write, and read modes. FIG. 3 is table which shows the voltages applied to source wiring S, bit line BL, control gate line CG, and selection gate line SG in each mode. There are three power-source voltages which can be applied in an integrated circuit incorporating an E$^2$PROM, i.e., ground power source voltage GND, read power source voltage Vcc, and write power source voltage Vpp. In ordinary operation, ground power source GND =0 V, read power source voltage Vcc =5 V, and write power source voltage Vpp =20 V. It should be noted that write power source voltage Vpp is not supplied by an external power source, but is generated in the integrated circuit itself by boosting read power source voltage Vcc.

The data erase mode, which is also known as the electron injecting mode, will now be described.

In the data erase mode, electrons are injected into floating gate electrode 16, to increase threshold voltage V$_{TH}$ of memory transistor 41. In the data erase mode, bit line BL =0 V, selection gate line SG =20 V, control gate line CG =20 V, and source wiring S =0 V. By setting selection gate line SG at 20 V, selection transistor 42 is rendered conductive, and the potential at n-type diffusion layer 12 becomes equal to that at bit line BL, i.e. 0 V. A high voltage is applied to floating gate electrode 16 from control gate line CG, and a high electric field is applied to thin insulating film 17 between floating gate electrode 16 and n-type diffusion layer 12. As a result, the electrons are injected into floating gate electrode 16 from n-type diffusion layer 12 by a tunnel current. As a result, threshold voltage V$_{TH}$ is increased up to, e.g., about 8 V.

The data write mode, also known as the electron discharge mode, will now be described.

In the data write mode, threshold voltage V$_{TH}$ of memory transistor 41 s decreased by discharging the electrons which were injected into floating gate electrode 16. In the data write mode, bit line BL =20 V, selection gate line SG =20 V, control gate line CG =0 V, and source wiring S =5 V. That is, the floating gate electrode 16 is set in a floating state. By setting selection gate line SG at 20 V, selection transistor 42 is rendered conductive and the potential at n-type diffusion layer 12 becomes equal to that at bit line BL, i.e., 20 V. A high electric field is applied to thin insulating film 17, in the opposite direction to that in the erase mode, the electrons are discharged from floating gate electrode 16 into n-type diffusion layer 1 by tunnel current. As a result, threshold voltage V$_{TH}$ of memory transistor 41 is decreased to, for example, $-5$ V.

In the data read mode, bit line BL =1 V, selection gate line SG =5 V, control gate line CG =0 V, and source wiring S =0 V. By setting selection gate line SG at 5 V, selection transistor 42 is rendered conductive, and the potential at n-type diffusion layer 12 becomes equal to that at bit line BL, i.e., 1 V. In this situation, when electrons are pre-injected into floating gate electrode 16, memory transistor 41 is not rendered conductive, this being due to threshold voltage V$_{TH}$ having been increased. For this reason, no current flows between bit line BL and source wiring S, and hence the potential at bit line BL is kept at 1 V. On the other hand, when the electrons are discharged from floating gate electrode 16, memory transistor 41 is rendered conductive, due to threshold voltage V$_{TH}$ being decreased. In these circumstances, current flows between bit line BL and source wiring S, and the potential at bit line BL becomes equal to that at source wiring S, i.e., 0 V. More specifically, logic "1" or "0" level is determined by amplifying the potential difference between 1 V and 0 V at bit line BL, using a sense amplifier (not shown) connected to bit line BL.

However, the problem which then arises is that the potential difference between 1 V and 0 V at bit line BL becomes amplified by the sense amplifier. That is, logic levels must be determined from the amplified potential difference.

The reason the potential at bit line BL must be limited to as low as 1 V and not increased up to 5 V in the read mode will now be explained below.

If bit line BL is set at 5 V in the read mode, the potential at n-type diffusion layer 12 becomes almost 5 V. As a result, an electric field generated by the potential difference between 0 V of control gate line CG and 5 V of n-type diffusion layer 12 is applied to thin insulating film 17 through floating gate electrode 16. In other words, this electric field is applied in the same direction as that in the write mode (electron discharge mode). The only difference, in this case, is that the intensity of this electric field is lower than that in the write mode. Consequently, if a cell in which electrons are injected is set in the read mode for a long period of time, the injected electrons are gradually discharged from floating gate electrode 16 because of the tunnel effect. As a result, threshold voltage $V_{TH}$ gradually decreases, which may give rise to a logical operation error occurring after a certain period of time. Such a phenomenon is known as a soft write (insufficient write) phenomenon. The retentivity of data as a function of time, in the event of a soft write phenomenon occurring is known as the read retention characteristic (data retentivity in the read mode).

To improve the read retention characteristic, the potential at bit line BL in thread mode can be lowered. However, in the read mode, the potential difference between an electron injection cell and an electron discharge cell becomes small, thereby degrading the logical margin. For this reason, in the conventional technique, bit line BL is set at about 1 V to sufficiently improve the read retention characteristic. On the other hand, a small logical margin is compensated for by using a high-performance sense amplifier or the like, and hence the sense amplifier is overloaded.

Accordingly, in the conventional technique, since the sense amplifier is overloaded, various problems are posed as follows. The arrangement of the sense amplifier is complicated, and the chip area of semiconductor memory is increased when the sense amplifier is formed into an integrated circuit. The increase in the chip area leads to an increase in manufacturing cost. In addition, the margin of operational power source voltage in the read mode is reduced, and especially, operation performance in a low-voltage range is degraded. Furthermore, a constant voltage source is required to apply an intermediate voltage of 1 V to bit line BL. If a circuit for generating such an intermediate voltage is incorporated in the sense amplifier, a current consumption is increased and this is disadvantageous in terms of power consumption. Finally, as the sense amplifier becomes complicated, the access time is increased.

SUMMARY OF THE INVENTION

It is an object of the present invention to provide a nonvolatile semiconductor memory in which low-voltage, low-power consumption operation can be performed, while peripheral circuits such as a sense amplifier can be simplified and thereby attain higher operation speeds.

The nonvolatile semiconductor memory according to the present invention comprises a semiconductor substrate of a first conductivity type, first, second, and third diffusion layers of a second conductivity type formed in the substrate, a first channel region formed between the first and second diffusion layers, a second channel region formed between the second and third diffusion layers, a floating gate electrode formed above the first channel region, part of which overlaps the second diffusion layer through a thin insulating film, a control gate electrode formed above the floating gate electrode, a gate electrode formed above the second channel region, a control gate line for applying predetermined voltages to the control gate electrode in the data erase, write, and read modes, respectively, a selection gate line for applying predetermined voltages to the gate electrode in the data erase, write, and read modes, respectively, a write line for applying predetermined voltages to the third diffusion layer in the data erase, write, and read modes, respectively, and a read line for applying predetermined voltages to the first diffusion layer in the data erase, write, and read modes, respectively.

BRIEF DESCRIPTION OF THE DRAWINGS

FIG. 4 is a sectional view showing the structure of elements of a memory cell of the nonvolatile semiconductor memory according to the present invention;

FIG. 8 is a circuit diagram showing another arrangement when the nonvolatile semiconductor memory according to the present invention is used as an E$^2$PROM;

FIG. 9 is a circuit diagram showing still another arrangement when the nonvolatile semiconductor memory according to the present invention is used as an E$^2$PROM;

FIG. 10 is a timing chart of the circuit shown in FIG. 9;

FIG. 13 is a circuit diagram showing, in detail, the sense amplifier used in the circuits shown in FIGS. 7, 8, 9, and 11.

DETAILED DESCRIPTION OF THE PREFERRED EMBODIMENT

Figure 1:
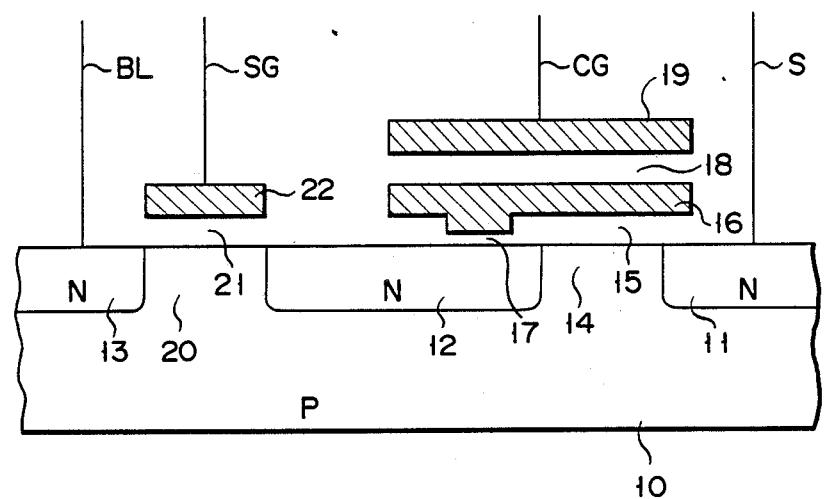
FIG. 1 is a sectional view showing a structure of elements of a conventional memory cell.
Figures 2, 3:
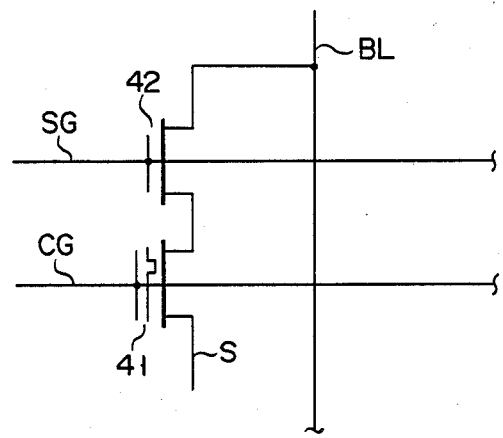
FIG. 2 shows the equivalent circuit diagram of the conventional memory cell of FIG. 1.
FIG. 3 is a table showing the voltage at each signal line of the conventional memory cell of FIG. 1, in each of its operation modes.

An embodiment of the present invention will be described below with reference to the accompanying drawings.

FIG. 4 is a sectional view showing the arrangement of a memory cell used in the nonvolatile semiconductor memory according to the present invention. N-type diffusion layers 11, 12, and 13 are formed in the surface of p-type semiconductor substrate 10. Channel region 14 is formed between diffusion layers 11 and 12. Polysilicon electrode 16 is formed above channel region 14, through relatively thick insulating film 15. In addition, electrode 16 overlaps n-type diffusion layer 12, through insulating film 17 which is thinner than insulating film 15. Polysilicon electrode 19 is formed above electrode 16, through relatively thick insulating film 18.

Channel region 20 is formed between diffusion layers 12 and 13. Polysilicon electrode 22 is formed above channel region 20, through relatively thick insulating film 21.

Read and write lines RL and WL are connected to diffusion layers 11 and 13, respectively. Electrodes 16, 19, and 22 are respectively used as a floating gate electrode, a control gate electrode, and a gate electrode. Electrodes 19 and 22 are connected to control gate line CG and selection gate line SG, respectively.

Figures 5, 6:
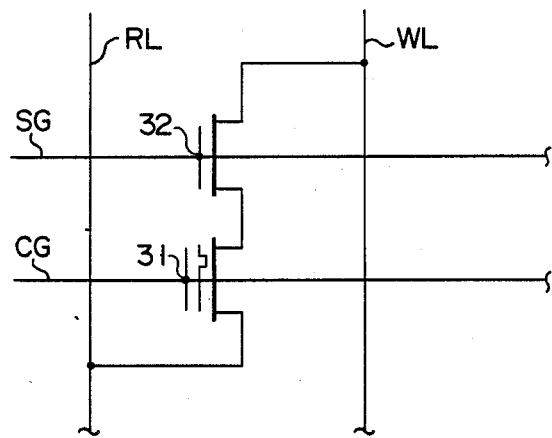
FIG. 5 shows an equivalent circuit diagram of the memory cell of FIG. 4.
FIG. 6 is a table showing a voltage at each signal line of the memory cell of the nonvolatile semiconductor memory cell shown in FIG. 4.

FIG. 5 shows an equivalent circuit diagram of the cell shown in FIG. 4. Transistor 31, as shown in FIG. 5, is of floating gate type. Diffusion layers 11 and 12 of transistor 31 are used as a source and a drain, respectively, transistor 31 itself constituting a memory transistor for storing data. Transistor 32 is of normal MOS type. Diffusion layers 12 and 13 of transistor 32 are used as a source and a drain, respectively, transistor 32 itself constituting a selection transistor for selecting memory transistor 31.

The operation modes of the emory cell having the above arrangement include data erase, write, and read modes, as in the case of the conventional memory cell. FIG. 6 is a table which shows the voltages applied to read line RL, write line WL, control gate line CG, and selection gate line SG in each mode.

In the data erase mode (electron injection mode), write line WL =0 V, selection gate line SG =20 V, control gate line CG =20 V, and read line RL =0 V. By setting selection gate line SG at 20 V, selection transistor 32 is rendered conductive, nd the potential at n-type diffusion layer 12 becomes equal to that of write line WL, i.e., 0 V. A high voltage is applied to floating gate electrode 16, through control gate line CG. Therefore, a high electric field is applied to thin insulating film 17 between floating gate electrode 16 and n-type diffusion layer 12, and electrons are injected into floating gate electrode 16 from n-type diffusion layer 12 by tunnel current. As a result, threshold voltage $V_{TH}$ of memory transistor 31 is increased to, for example, 8 V.

In the data write mode (electron discharge mode), write line WL =20 V, selection gate line SG =20 V, control gate line CG =0 V, and read line RL =5 V. By setting selection gate line SG at 20 V, selection transistor 32 is rendered conductive, and the potential of n-type diffusion layer 12 becomes equal to write line WL, i.e., 20 V. A high electric field is applied to thin insulating film 17, in the opposite direction to that in the erase mode. Consequently, the electrons are discharged from floating gate electrode 16 into n-type diffusion layer 12 by tunnel current. As a result, threshold voltage $V_{TH}$ of memory transistor 31 is decreased to, for example, 31 5 V. Accordingly, in the data erase and write modes, the same operation is performed as in the conventional cell.

In the data read mode, write line WL =0 V, selection gate line SG =5 V, control gate line CG =0 V, and read line RL =5 V. By setting selection gate line SG at 5 V, selection transistor 32 is rendered conductive, the potential at n-type diffusion layer 12 becomes equal to that at write line WL, i.e., 0 V. When electrons are injected into gate electrode 16 thereafter, memory transistor 31 is not rendered conductive because threshold voltage $V_{TH}$ is increased. For this reason, a current does not flow between read line RL and write line WL, and hence the potential at read line RL is kept at 5 V. On the contrary, when the electrons are discharged from floating gate electrode 16, memory transistor 31 is rendered conductive because threshold voltage $V_{TH}$ is decreased. For this reason, a current flows between read line RL and write line WL, and the potential at read line RL becomes nearly equal to that at write line WL, i.e., 0 V. In this case, logic "1" or "0" level is determined by amplifying the potential difference between potentials of 5 V and 0 V at read line RL using a sense amplifier (not shown) connected to read line RL.

A very important point is that a source voltage of 5 V in the ordinary read mode can be directly applied to read line RL. In addition, even if 5 V is applied to read line RL, the occurrence of the soft write phenomenon can be prevented, and the read retention characteristic can be greatly improved. This is because in the read mode, since selection gate line SG =5 V and write line WL =0 V, the potential at n-type diffusion layer 12 is set at 0 V. More specifically, control gate line CG is set at 0 V, the potential at floating gate electrode 16 is set at substantially 0 V, and n-type diffusion layer 12 is set at 0 V. Therefore, an electric field is to applied to thin insulating film 17 disposed between floating gate electrode 16 and n-type diffusion layer 12. Therefore, electron injection or discharge into/from floating gate electrode 16 due to the tunnel effect does not occur.

Figure 7:
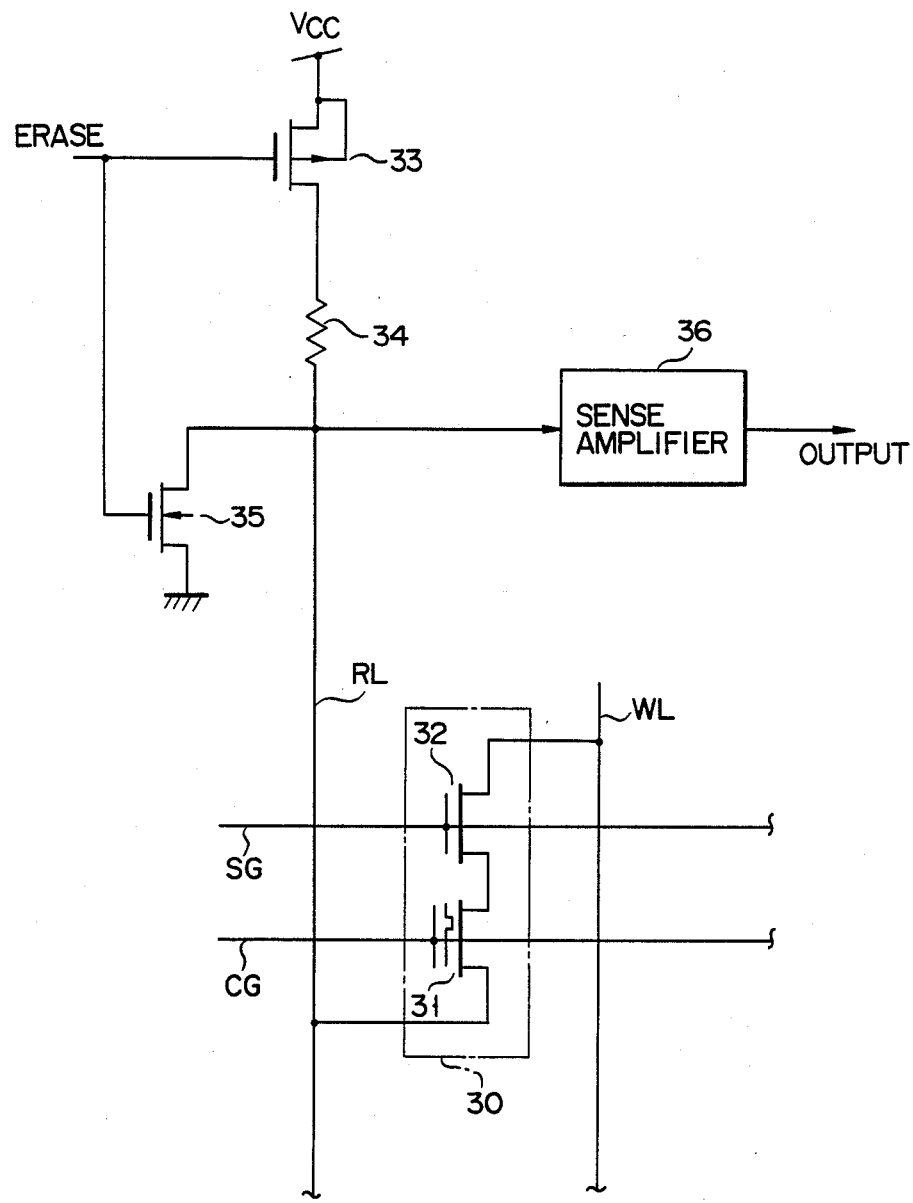
FIG. 7 is a circuit diagram wherein the nonvolatile semiconductor memory according to the present invention is used as an E$^2$PROM.

FIG. 7 is a circuit diagram showing a schematic arrangement when a nonvolatile semiconductor memory of the present invention is applied to an E²PROM. In the memory of this embodiment, only single memory cell 30 consisting of memory transistor 31 and selection transistor 32 is shown to simplify the description. Memory cell 30 has a sectional structure similar to that in FIG. 4. P-channel MOS transistor 33 for switching and resistor 34 as a load are series-connected between read power source voltage cc and read line RL. In addition, n-channel MOS transistor 35 for switching is connected between read line RL and ground (0 V). Gate electrodes o both switching transistors 33 and 35 are commonly connected. Signal Erase, whose potential is set at 5 V in the data erase mode and at 0 V in other modes, is supplied to the common node of the gate electrodes. The input terminal of sense amplifier 36 is connected to read line RL.

Assume that the sum of an ON resistance of transistor 33 and a resistance of resistor 34 is Rr, a resistance between read and write lines RL and WL when electrons are injected into memory cell 30 is Roff, and a resistance between read and write lines RL and WL when the electrons are discharged from memory cell 30 is Ron. Resistance Rr is set so as to satisfy the following relationship.

$$Roff >> Rr >> Ron \qquad 1$$

In such a memory, when memory cell 30 is set in the electron injection and discharge modes, the potential at read line RL is changed substantially from 5 V to 0 V in each mode. More specifically, when the potential of signal Erase is set at 5 V in the data erase mode, transistor 35 is rendered conductive, and the potential at read line RL is set at 0 V when transistor 35 is rendered conductive. In this case, since transistor 33 is rendered nonconductive, a current does not flow through resistor 34. On the other hand, the potential of signal Erase is 0 V in the modes other than the data erase mode. Since transistors 35 and 33 are rendered nonconductive and conductive, respectively, the potential at read line RL is set at read power source voltage Vcc, i.e., 5 V through resistor 34. Even if the value of read power source voltage Vcc is decreased, the potential at read line RL is changed substantially from read power source voltage Vcc to 0 V. Therefore, a sufficient operation margin can be obtained in a low-voltage operation. In addition, since an intermediate voltage of 1 V is not required unlike in the conventional memory, a circuit for generating an intermediate voltage can be omitted, thereby decreasing a current consumption.

A description will be made of the voltage ranges respectively set in the data erase, write, and read modes in the memory according to the present invention with reference to FIG. 6. The voltage ranges at write line WL, selection gate line SG, control gate line CG, and read line RL are respectively set as 0 V to 20 V (high-voltage system), 5 V to 20 V (low- and high-voltage systems), 0 V to 20 V (high-voltage system), and 0 V to 5 V (low-voltage system). More specifically, both the high- and low-voltage systems are present only at selection gate line SG. Other lines, i.e., write line WL, control gate line CG, and read line RL are divided into the high- and low-systems. For this reason, the arrangement of peripheral circuits for processing signals from these lines can be considerably simplified. More specifically, in the memory of this embodiment, the peripheral circuits can be divided into the high- and low-systems, thereby simplifying the circuit arrangement.

FIG. 8 is a circuit diagram schematically showing an arrangement of another embodiment according to the present invention. In a memory of this embodiment, p-channel MO transistor 33 in FIG. 7 is used as a load for read line RL. Note that if an ON resistance of single transistor 33 is Rr, resistance Rr is set so as to satisfy inequality 1 above.

FIG. 9 is a circuit diagram schematically showing an arrangement of still another embodiment according to the present invention. In a memory of this embodiment, p-channel MOS transistor 33 is used as a load for read line RL as in the embodiment in FIG. 8. I this embodiment, an output from OR gate 37 is supplied to the gate electrode of transistor 33. Signal Erase described above and clock signal $\phi$ are supplied to OR gate 37. More specifically, in the embodiment, in the modes other than the data erase mode, transistor 33 is controlled to be temporarily rendered conductive within a period when clock signal $\phi$ is set at 0 V. Therefore, a logically true period (Vcc level setting period) at read line RL is a period between $t_1$ and $t_2$ while $\phi=0$ V, as shown in FIG. 10.

According to the above arrangement, in the data write and read modes, a read current flowing from power source Vcc to write line WL through read line RL and memory cell 30 can be restricted within the period while $\phi=0$ V. As a result, a current consumption can be further decreased.

Figure 11:
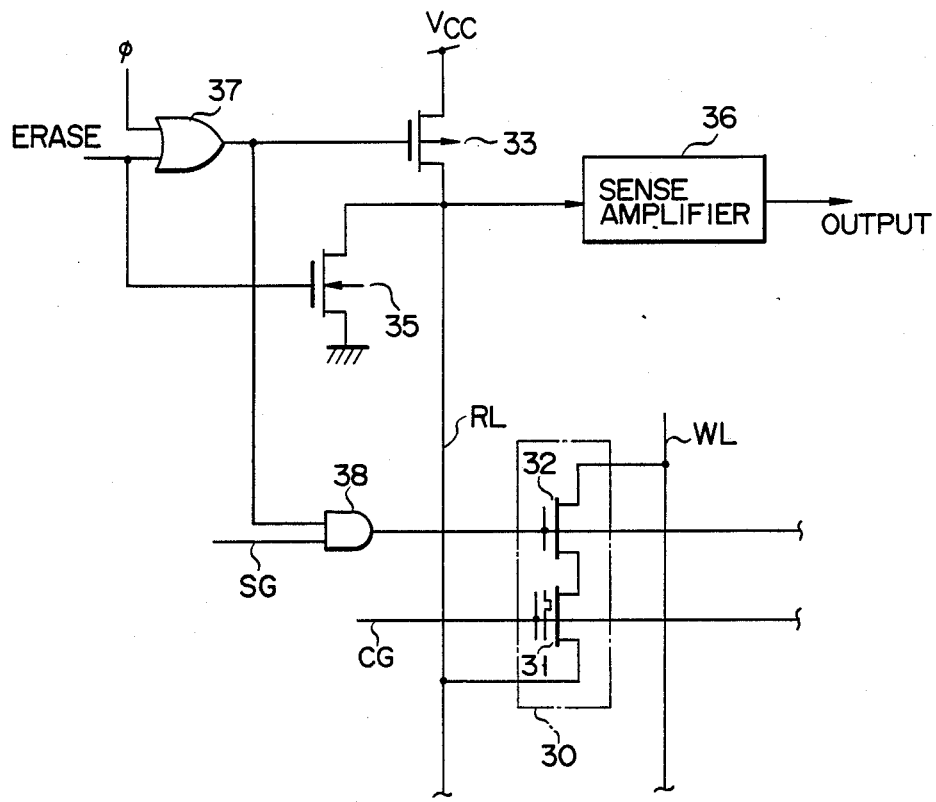
FIG. 11 is a circuit diagram showing still another arrangement when the nonvolatile semiconductor memory according to the present invention is used as an E$^2$PROM.

FIG. 11 is a circuit diagram schematically showing an arrangement of still another embodiment according to present invention. In a memory of this embodiment, p-channel MOS transistor 33 is used as a load circuit for read line RL. The gate electrode of p-channel MOS transistor 33 receives an output signal from OR gate 37. In addition, the voltage of selection gate line SG is not immediately supplied to the gate electrode of selection transistor 32, but the application of voltage is controlled by using AND gate 38 ON/OFF controlled by an output signal from OR gate 37.

Figure 12:
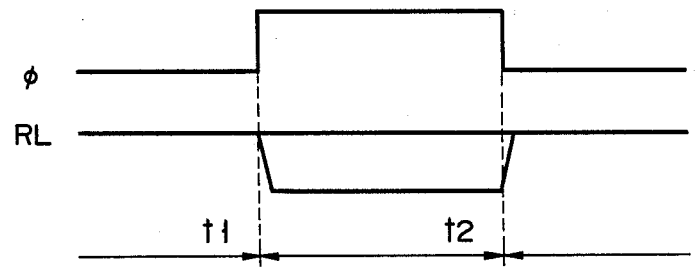
FIG. 12 is a timing chart of the circuit shown FIG. 11.

FIG. 12 is a timing chart of the operation of the memory in FIG. 11. While $\phi=0$ V, a pre-charge period continues, i.e., p-channel MOS transistor 33 is kept conductive, and read line RL is pre-charged by read power source voltage Vcc. At this time, since an output from AND gate 38 is 0 V and selection transistor 32 which receives this output is rendered nonconductive, a current does not flow from read line RL to write line WL through memory cell 30.

While $\phi=5$ V, i.e., the period from $t_1$ to $t_2$, the logically true period continues and p-channel MOS transistor 33 is kept nonconductive. During this period, selection gate line SG $=5$ V, and an output from AND gate 38 is 5 V. For this reason, selection transistor 32 is rendered conductive. Therefore, if electrons are injected into emory cell 30, a potential of 5 V at read line RL is held. If electrons are discharged from memory cell 30, the potential of read line RL becomes 0 V.

As is apparent from the above description, according to the memory in this embodiment, a DC current path, through which a current flows from read power source voltage Vcc to write line WL through read line RL and memory cell 30, is not present. Therefore, a current consumption can be further decreased compared with the memory in the embodiment of FIG. 9.

FIG. 13 is a circuit diagram showing, in detail, sense amplifier 36 used in each embodiment described above together with memory cell 30. Circuit 39 connected between read power source voltage Vcc and read line RL corresponds to the circuit including resistor 34 and switching transistors 33 and 35 in FIG. 7, the circuit including switching transistors 33 and 35 in FIG. 8, or the circuit including transistors 33 and 35, and OR gate 37 in FIG. 9.

More specifically, unlike in the conventional memory, a complicated sense amplifier for amplifying a small potential is not necessary for changing the voltage at read line RL from 0 V to 5 V regardless of a type of load connected between read power source voltage Vcc and read line RL. For example, as shown in FIG. 13, an inverter can be used as sense amplifier 36. For this reason, a sense amplifier can be simplified, while an access time can be shortened.

As has been described above, according to the present invention, there is provided a nonvolatile semiconductor memory which can be operated at a low voltage and a low power consumption, and can realize simplified, high-speed peripheral circuits such as a sense amplifier.

What is claimed is:

1. A nonvolatile semiconductor memory comprising:
   a substrate of a first conductivity type;
   first, second, and third diffusion layers, of a second conductivity type, formed in said substrate;
   a first channel region formed in that portion of said substrate which extends between said first and second diffusion layers;
   a second channel region formed in that portion of said substrate which extends between said second and third diffusion layers;
   a floating gate electrode formed above said first channel region, part of said floating gate electrode being formed on a thin insulating film formed on said second diffusion layer;
   a control gate electrode formed above said floating gate electrode;
   a gate electrode formed above said second channel region;
   a control gate line for applying a first voltage to said control gate electrode in a data erase mode, and for applying a second voltage, lower than the first voltage, to said control gate electrode in a data write mode and a data read mode;

a selection gate line for applying the first voltage to said gate electrode in the date erase mode and data write mode, and for applying a third voltage, which is lower than the first voltage and higher than the second voltage, to said gate electrode in the data read mode;

a write line for applying the second voltage to said third diffusion layer in the data erase mode and the data read mode, and for applying the first voltage to said third diffusion layer in the data write mode; and a read line for applying the second voltage to said first diffusion layer in the data erase mode, and for applying the third voltage to said first diffusion layer in the data write mode and the data read mode.

2. A memory according to claim 1, wherein the first voltage is a write power source voltage, the second voltage is a ground source voltage, and the third voltage is a read power source voltage.

3. A memory according to claim 1, wherein said read line is connected to a power source via a load circuit, and a signal from said read line is supplied to a sense amplifier.

4. A memory according to claim 3, wherein said load circuit comprises a MOS transistor which is normally rendered conductive.

5. A memory according to claim 3, wherein said load circuit comprises a MOS transistor which is temporarily rendered conductive in accordance with a clock signal.

6. A memory according to claim 5, wherein the voltage on said selection gate line is applied to said gate electrode in synchronism with the lock signal.

7. A memory according to claim 3, wherein said sense amplifier is an inverter.

* * * * *